(12) United States Patent
Song (10) Patent No.: US 9,430,339 B1
(45) Date of Patent: Aug. 30, 2016

(54) METHOD AND APPARATUS FOR USING WEAR-OUT BLOCKS IN NONVOLATILE MEMORY

(71) Applicant: Marvell International Ltd., Hamilton (BM)

(72) Inventor: Jong-uk Song, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 164 days.

(21) Appl. No.: 14/140,295

(22) Filed: Dec. 24, 2013

Related U.S. Application Data (60) Provisional application No. 61/746,208, filed on Dec. 27, 2012, provisional application No. 61/747,598, filed on Dec. 31, 2012, provisional application No. 61/770,634, filed on Feb. 28, 2013.

(51) Int. Cl.
*G06F 11/00* (2006.01)
*G06F 11/16* (2006.01)

(52) U.S. Cl.
CPC ................................ *G06F 11/1666* (2013.01)

(58) Field of Classification Search
USPC .......................................................... 714/42
See application file for complete search history.

(56) References Cited

U.S. PATENT DOCUMENTS

| | | | |
|---|---|---|---|
| 5,263,003 A | 11/1993 | Cowles et al. | |
| 5,479,638 A | 12/1995 | Assar et al. | |
| 5,530,828 A | 6/1996 | Kaki et al. | |
| 5,815,441 A | 9/1998 | Kobatake | |
| 6,000,006 A | 12/1999 | Bruce et al. | |
| 6,081,447 A | 6/2000 | Lofgren et al. | |
| 6,131,139 A | 10/2000 | Kikuchi et al. | |
| 6,230,233 B1 | 5/2001 | Lofgren et al. | |
| 6,732,221 B2 | 5/2004 | Ban | |
| 6,751,155 B2 | 6/2004 | Gorobets | |
| 6,831,865 B2 | 12/2004 | Chang et al. | |
| 6,898,662 B2 | 5/2005 | Gorobets | |
| 7,002,851 B2 | 2/2006 | Yamagami et al. | |
| 7,006,386 B2 | 2/2006 | Yamagami et al. | |
| 7,035,967 B2 | 4/2006 | Chang et al. | |
| 7,064,995 B2 | 6/2006 | Yamagami et al. | |
| 7,120,729 B2 | 10/2006 | Gonzalez et al. | |
| 7,158,411 B2 | 1/2007 | Yeh et al. | |
| 7,269,708 B2 | 9/2007 | Ware | |
| 7,287,118 B2 | 10/2007 | Chang et al. | |
| 7,366,034 B2 | 4/2008 | Kozakai et al. | |
| 7,369,438 B2 | 5/2008 | Lee | |
| 7,441,067 B2 | 10/2008 | Gorobets et al. | |
| 7,475,184 B2 | 1/2009 | Lee | |
| 7,489,562 B2 | 2/2009 | Maayan et al. | |
| 8,120,969 B1 | 2/2012 | Montierth et al. | |
| 2004/0080985 A1 | 4/2004 | Chang et al. | |
| 2008/0094914 A1 | 4/2008 | Park et al. | |
| 2008/0140918 A1 | 6/2008 | Sutardja | |

(Continued)

*Primary Examiner* — Sarai Butler (57) ABSTRACT

Some of the embodiments of the present disclosure provide a method comprising: storing volatile data in nonvolatile memory; over a time interval, periodically refreshing the volatile data by (i) reading the volatile data from the nonvolatile memory and (ii) rewriting the volatile data to the nonvolatile memory; determining a number of errors in the volatile data that is read during the periodic refresh of the volatile data; and based, at least in part, on the number of errors that is determined, modifying the time interval. The method may also comprise decreasing the time interval if the number of errors is determined to be greater than an error threshold value.

20 Claims, 5 Drawing Sheets

(56) References Cited

U.S. PATENT DOCUMENTS

| | | |
|---|---|---|
| 2008/0279005 A1 | 11/2008 | France |
| 2009/0003058 A1 | 1/2009 | Kang |
| 2009/0122949 A1 | 5/2009 | Reid et al. |
| 2009/0172255 A1 | 7/2009 | Yeh et al. |
| 2010/0002522 A1 | 1/2010 | Park |
| 2010/0064096 A1 | 3/2010 | Weingarten et al. |
| 2010/0106901 A1* | 4/2010 | Higeta et al. ............... 711/106 |
| 2010/0318719 A1 | 12/2010 | Keays et al. |
| 2011/0271141 A1* | 11/2011 | Kursun ............... G06F 11/008 714/6.3 |
| 2012/0042204 A1* | 2/2012 | Smith et al. ............... 714/6.32 |
| 2012/0117304 A1 | 5/2012 | Worthington et al. |
| 2013/0117600 A1* | 5/2013 | Eleftheriou et al. ............... 714/1 |
| 2014/0059396 A1* | 2/2014 | Matsuyama et al. ............... 714/54 |

* cited by examiner

METHOD AND APPARATUS FOR USING WEAR-OUT BLOCKS IN NONVOLATILE MEMORY

CROSS REFERENCE TO RELATED APPLICATIONS

This application claims priority to U.S. Provisional Patent Application No. 61/746,208, filed on Dec. 27, 2012; U.S. Provisional Patent Application No. 61/747,598, filed on Dec. 31, 2012; and U.S. Provisional Patent Application No. 61/770,634, filed on Feb. 28, 2013, which are incorporated herein by reference. This application is also related to U.S. Pat. No. 7,710,777, issued on May 4, 2010; U.S. Pat. No. 8,000,142, issued on Aug. 16, 2011; U.S. Pat. No. 8,120,969, issued on Feb. 21, 2012; U.S. Pat. No. 8,437,189, issued May 7, 2013; U.S. patent application Ser. No. 13/888,119, filed on May 6, 2013 (currently pending); and U.S. Pat. No. 8,434,193, issued May 7, 2013, which are incorporated herein by reference.

TECHNICAL FIELD

Embodiments of the present disclosure relate to memory devices, and more particularly to nonvolatile memory devices.

BACKGROUND

Unless otherwise indicated herein, the approaches described in this section are not prior art to the claims in the present disclosure and are not admitted to be prior art by inclusion in this section.

Memory devices are employed in many types of electronic devices, such as computers, cell phones, PDA's, data loggers, and navigational equipment, just to name a few examples. Among such electronic devices, various types of nonvolatile memory devices may be employed, such as NAND or NOR flash memories, SRAM, DRAM, and phase-change memory, just to name a few examples. In general, writing or programming processes may be used to store information in such memory devices, while a read process may be used to retrieve stored information.

Flash memories typically preserve stored information even in power-off conditions. In such memories, in order to change a logic state of a cell, e.g. a bit, an electric charge present in a floating gate of the cell may be changed by application of electric potentials to various portions of the cell. A "0" state typically corresponds to a negatively charged floating gate and a "1" state typically corresponds to a positively charged floating gate. As intended, a nonvolatile memory may preserve stored information over time, but a reliability of such a memory may be limited by degenerative processes affecting a tunnel oxide of the memory during various programming and erasing cycles. As a cell is programmed and erased, electrons move to and from the floating gate through the tunnel oxide. Such electrons may create "traps" in the oxide (i.e., defects in the oxide in which electrons may be trapped). Trap density may increase with the number of program and erase cycles experienced by the tunnel oxide. Due to the presence of these traps, a programmed or erased floating gate may show an enhanced charge loss and/or charge gain even under relatively low electric fields across the tunnel oxide commonly seen during normal conditions of storage and reading of the cell. Such low level charge loss and/or charge gain mechanisms, which may lead to information loss, are undesirable since flash memory devices are expected to be able to store information on the order of at least several years. Accordingly, these nonvolatile memory devices may comprise memory cells that slowly deteriorate over time, leading to an increasing probability that a read and/or write error may occur upon accessing such a memory cell. Though such errors may be subsequently corrected within a memory device, for example, such error correction may become difficult or impossible as the number of errors increases.

SUMMARY

In various embodiments, the present disclosure provides a method comprising: storing volatile data in nonvolatile memory; over a time interval, periodically refreshing the volatile data by (i) reading the volatile data from the nonvolatile memory and (ii) rewriting the volatile data to the nonvolatile memory; determining a number of errors in the volatile data that is read during the periodic refresh of the volatile data; and based, at least in part, on the number of errors that is determined, modifying the time interval. The method may also comprise decreasing the time interval if the number of errors is determined to be greater than an error threshold value. In some embodiments, the volatile data is stored in a block of the nonvolatile memory. Accordingly, the method may further comprise discontinuing use of the block of the nonvolatile memory for the volatile data if the time interval that is modified is less than a time threshold. The method may also comprise writing the volatile data to another block. In some embodiments, determining the number of errors in the volatile data that is read during the periodic refresh of the volatile data is performed by an error correction code (i) after reading the volatile data from the nonvolatile memory and (ii) before rewriting the volatile data to the nonvolatile memory. In some embodiments, the periodic refresh of the volatile data is performed without erasing any portion of the volatile data stored in the nonvolatile memory.

In various embodiments, the present disclosure provides a system comprising: a nonvolatile memory and a memory controller configured to: store volatile data in the nonvolatile memory; over a time interval, periodically refresh the volatile data by (i) reading the volatile data from the nonvolatile memory and (ii) rewriting the volatile data to the nonvolatile memory; determine if a number of errors in the volatile data that is read during the periodic refresh of the volatile data is greater than an error threshold value; and modify the time interval based, at least in part, on the number of errors that is determined.

In various embodiments, the present disclosure provides a nonvolatile memory device comprising: a memory cell array including a wear-out memory portion and a controller configured to: store volatile data in the wear-out memory portion; refresh the volatile data by (i) reading the volatile data from the wear-out memory portion and (ii) rewriting the volatile data to the wear-out memory portion, wherein the volatile data is refreshed periodically at a time interval; determine if a number of errors in the volatile data that is read during the periodic refresh of the volatile data is greater than an error threshold value; and modify the time interval based, at least in part, on the number of errors detected in the volatile data that is read during the periodic refresh.

BRIEF DESCRIPTION OF THE DRAWINGS

In the following detailed description, reference is made to the accompanying drawings which form a part hereof wherein like numerals designate like parts throughout, and in which is shown by way of embodiments that illustrate principles of the present disclosure. It is to be understood that other embodiments may be utilized and structural or logical changes may be made without departing from the scope of the present disclosure. Therefore, the following detailed description is not to be taken in a limiting sense, and the scope of embodiments in accordance with the present disclosure is defined by the appended claims and their equivalents.

DETAILED DESCRIPTION

Memory devices, such as nonvolatile memory devices, comprise memory cells that can slowly deteriorate over time, leading to an increased probability that one or more errors occur while reading data stored in such memory devices. If the number of errors in read data is relatively small, the errors can be corrected using error correction codes (ECC) or other such algorithms. Any of a number of areas within a computing system can host ECC, such as a processor or memory controller, for example. If the number of errors in data read from particular memory cells or location (e.g., block) in memory of a computing system is relatively high, or exceeds the number of errors that ECC of the computing system is capable of correcting, a determination can be made as to whether or not to continue to utilize such error-prone memory cells. For example, error-prone portions of a memory can be designated as "bad" and abandoned so they no longer store data. In some embodiments, such a determination can be based, at least in part, on a comparison of the number of errors to an error threshold, which can be defined by user input or during a design stage of a memory device. If error-prone memory cells of a nonvolatile memory device are to be used, storing data in these memory cells involves memory-refresh processes that treat the data as though the data is volatile data, as described below.

In some embodiments, a memory controller determines whether or not a memory cell is too error-prone to be used, or in what fashion the memory cell is to be used. For nonvolatile memory, such determination is based on blocks of memory cells, rather than individual memory cells. For example, if the memory controller determines that one or a few memory cells of a block are not useable, the entire block is designated as a bad block, which is no longer used to store data. In some implementations, a process of retiring a portion of a memory as a bad block includes remapping an address of a to-be-retired portion of the memory to correspond to an address of a new, replacement portion of the memory device. Such a replacement portion includes a standard memory block or a wear-out block.

In another example, if the memory controller determines that one or a few memory cells of a block are useable in particular operating conditions (as described below), the entire block is designated as a "wear-out" block, which is operated as volatile memory. In particular, the memory controller determines whether or not a memory block is too error-prone to be used as regular nonvolatile memory, but can be used as volatile memory. Embodiments herein provide a benefit in that such memory blocks designated as wear-out blocks, which would otherwise be abandoned as bad blocks, can continue to be used to store data. One benefit of using wear-out blocks is that storing capacity and/or lifetime of a nonvolatile memory device increases compared to the case where wear-out blocks are designated as bad blocks and no longer used. Another benefit of using wear-out blocks is that relatively less reliable memory technologies or products, such as currently disregarded nonvolatile memory die having less than reliable test results or relatively poor performance (e.g., based on data storage stability or error generation) can be used, thereby increasing production yield.

Figure 1:
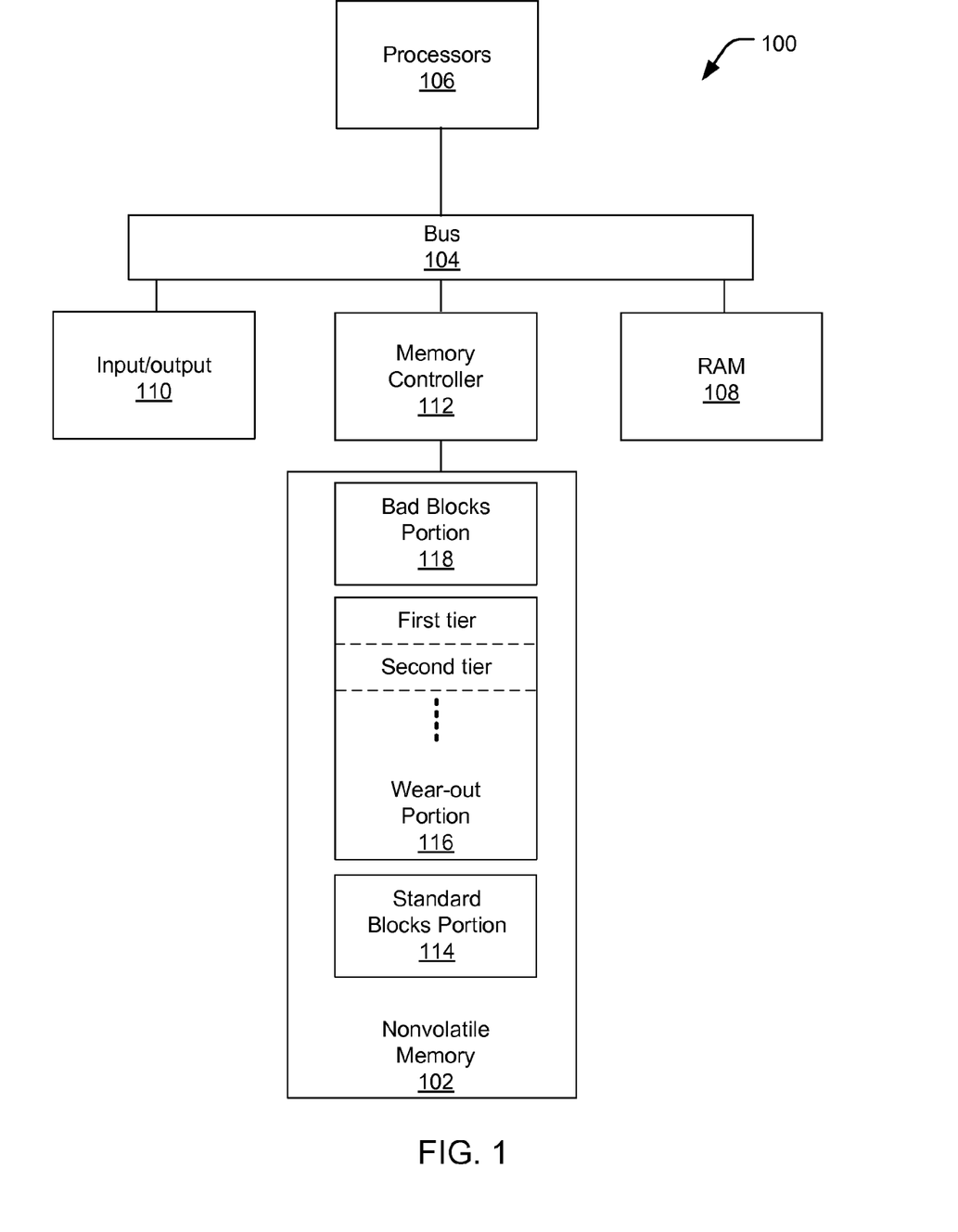
FIG. 1 is a block diagram of a host system or computing device, according to some embodiments.

FIG. 1 illustrates a host system or computing device 100 incorporating a nonvolatile memory 102, according to various embodiments. Nonvolatile memory can comprise flash memory, for example. Computing device 100 includes a system bus 104 that allows processors 106, random access memory (RAM) 108, and one or more input/output interfaces 110 to communicate. For example, input/output devices 110 can include a display, keyboard, keypad, mouse, and so on. Though not shown, computing device 100 can include other components, such as display devices and networking devices.

In various embodiments, nonvolatile memory 102 interfaces with system bus 104 through a memory controller 112. In some implementations, nonvolatile memory 102 comprises a NAND flash memory device, which can be a single chip or a die. Alternatively, nonvolatile memory 102 can be a multi-chip module or multiple discrete components that form a chip set. In some embodiments, computing device 100 can be implemented on a single chip in a single package, though claimed subject matter is not so limited.

Memory controller 112 can be incorporated into nonvolatile memory 102 as a single chip or as a separate component capable of exerting control over nonvolatile memory 102. Memory controller 112 controls a number of processes performed on nonvolatile memory 102, such as partitioning memory cells or blocks of nonvolatile memory 102, storing data, reading data, and erasing data.

In various embodiments, memory controller 112 can partition memory of nonvolatile memory 102 into two or more memory portions. For example, memory controller 112 can partition nonvolatile memory 102 into a standard blocks portion 114, a wear-out portion 116, and a bad blocks portion 118. Partitioning may involve designating blocks of physical memory as standard blocks, wear-out blocks, or bad blocks. Such partitioning need not operate on contiguous memory blocks, so that a bad block, for example, can be located in any location in a memory cell array with respect to another bad block.

Wear-out portion 116 can be further partitioned into a first tier, a second tier, and so on, as explained below. Data retention time varies for the different tiers. Accordingly, refresh time also varies for the different tiers. Refresh operations include read/error-correction/program processes that consume time and power and give rise to stress on target memory cells. By partitioning wear-out block into tiers, total refresh operations can be minimized or reduced.

The Memory controller 112 designates blocks in nonvolatile memory 102 as being in one of standard blocks portion 114, tiers of wear-out portion 116, and bad blocks portion 118. Such designation is based, at least in part, on number and/or frequency of errors generated by blocks of nonvolatile memory 102 when the blocks are read. An ECC decoder, for example, is used to determine a bit error rate and/or the number of bit errors associated with reading a particular portion (e.g., block) of nonvolatile memory 102. Subsequently, the bit error rate and/or number of bit errors is compared to an error threshold corresponding to the number of errors that is acceptable in view of error-correcting capability of memory controller 112 (or other portion of computing device 100). For example, memory controller 112 can include ECC capability to correct no greater than two bit errors in a block of read data. In such a case, memory controller 112 can designate any block of nonvolatile memory 102 as a bad block or a wear-out block if the block generates greater than two bit errors.

Memory controller 112 designates a block as a standard block if the block can be operated successfully as standard nonvolatile memory. In this case, occurrence of bit errors is relatively small or infrequent. On the other hand, memory controller 112 designates a block as a bad block or a wear-out block depending, at least in part, on whether or not the block can be operated successfully as volatile memory. If so, memory controller 112 designates the block as a wear-out block, otherwise the block is designated as a bad block. Moreover, memory controller 112 can further designate a wear-out block as a first tier wear-out block, a second tier wear-out block, and so on. Different tiered wear-out blocks are operated with differing process parameters. For example, data stored in a second tier wear-out block is refreshed more frequently than a first tier wear-out block. This difference in refresh frequency is a result from the fact that a second tier wear-out block retains data poorly compared to a first tier wear-out. Accordingly, data stored in second tier wear-out block is refreshed with a period short enough to not provide the stored data time to be lost.

Figure 2:
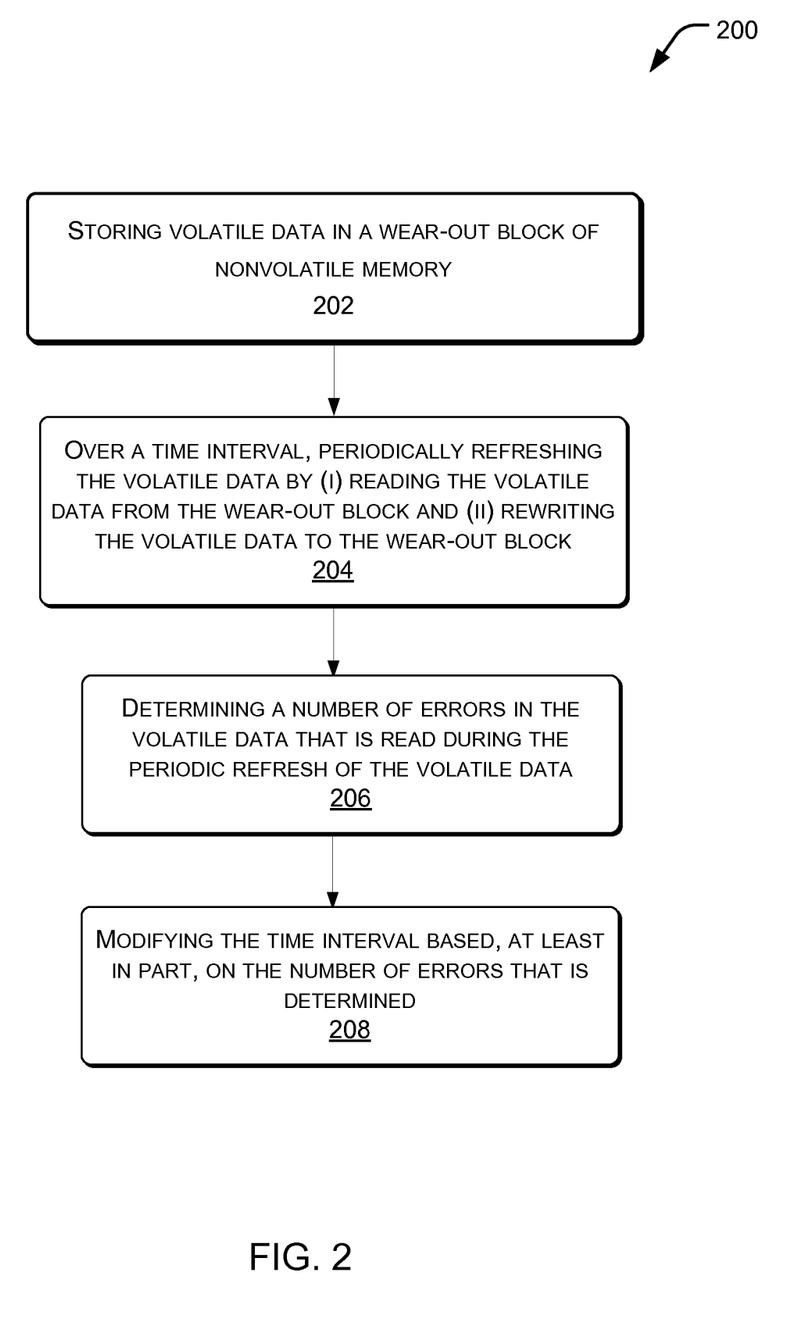
FIG. 2 is a flow diagram of a process for storing data in nonvolatile memory, according to some embodiments.

FIG. 2 is a flow diagram of a process 200 for storing data in nonvolatile memory, such as nonvolatile memory 102, according to some embodiments. Process 200 incorporates techniques described herein, of which one or more steps may be implemented by one or more processors and/or a memory controller. This process (as well as other methods, processes, and techniques described throughout) is illustrated as a logical flow graph, each operation of which represents a sequence of operations that can be partly or wholly implemented in hardware, software, or a combination thereof. In the context of software, the operations represent computer-executable instructions stored on one or more tangible computer-readable storage media that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described operations can be combined in any order and/or in parallel to implement the processes. Furthermore, while the architectures and techniques described herein have been described with respect to servers and user equipment, the architectures and techniques are equally applicable to processors and processing cores in other environments and computing devices.

At 202, a memory controller, such as memory controller 112, stores data in a wear-out block of nonvolatile memory. For example, such data can comprise volatile data that will be periodically refreshed. At 204, memory controller 112 periodically refreshes the data by reading the data from the wear-out block and by rewriting the data back into the wear-out block. Such periodic refreshing of the data is performed at periodic time intervals. At 206, memory controller 112 determines a number of errors in the data that is read during the periodic refresh of the data. For example, memory controller 112 is configured to determine a number of read errors or error rate using ECC. Determining the number of errors is performed by the ECC after reading the data from the wear-out block and before rewriting the data back into the wear-out block. At 208, memory controller 112 can modify the time interval between refresh processes based, at least in part, on the number and/or frequency of errors that is determined. For example, as more errors are detected, the time interval is reduced so that the data stored in the wear-out block is refreshed more frequently. More frequent refreshes of data stored in a wear-out block help prevent the wear-out block from having enough time to generate an excess number of bit errors while storing the data. In some implementations, error thresholds can be used to govern how memory controller 112 modifies the time interval. For example, if the number and/or frequency of errors is beyond an error threshold, memory controller 112 reduces the time interval between refresh processes. There can be multiple error thresholds, wherein the number of thresholds exceeded determines to which tier the wear-out block should be designated. For example, if a number of errors detected while reading data stored in a first-tier wear-out memory passes a third error threshold, then the first-tier wear-out memory can be designated as a second-tier wear-out memory and/or the time interval between refreshes can be reduced.

Figure 3:
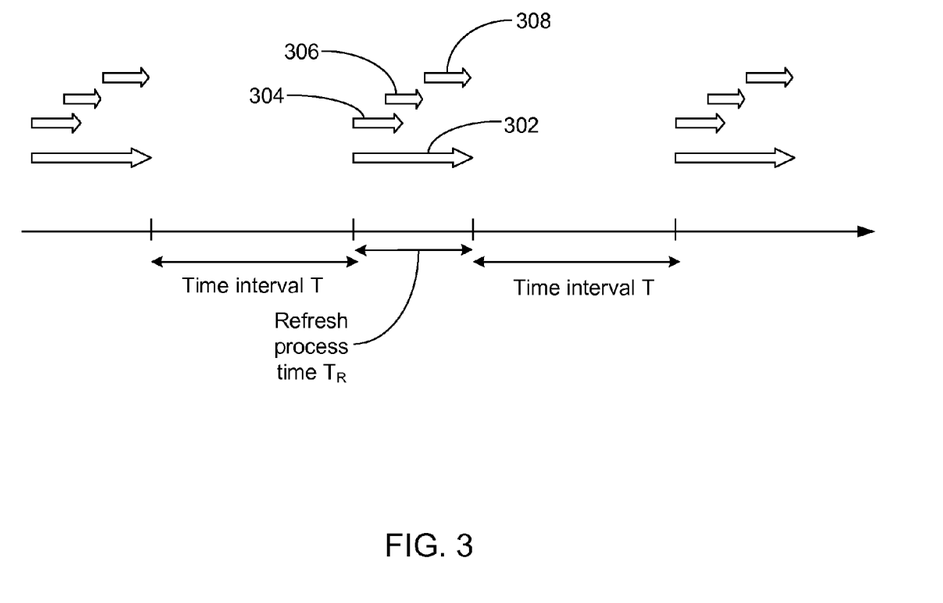
FIG. 3 is a time flow diagram of a process for storing data in nonvolatile memory, according to some embodiments.

FIG. 3 is a time flow diagram of a process for storing data in nonvolatile memory, such as nonvolatile memory 102, according to some embodiments. For example, such a process can be similar to or the same as process 200 of FIG. 2. Data stored in a wear-out block of nonvolatile memory is refreshed periodically with a time interval T. In other words, the time interval T separates periodic refresh processes 302 for refreshing data. The time it takes to perform each refresh process 302 is refresh process time $T_R$. During this time, refresh process 302 includes a read process 304, an error correction process 306, and a rewrite process 308. Read process 304 includes reading data stored in a wear-out block. Error correction process 306, which may temporally overlap with read process 304, includes applying ECC to the read data to correct one or a few bit errors that the wear-out block may have generated while storing the data. These errors would then be included in the read data. Rewrite process 308 includes rewriting the ECC-corrected data back into the wear-out block.

Figure 4:
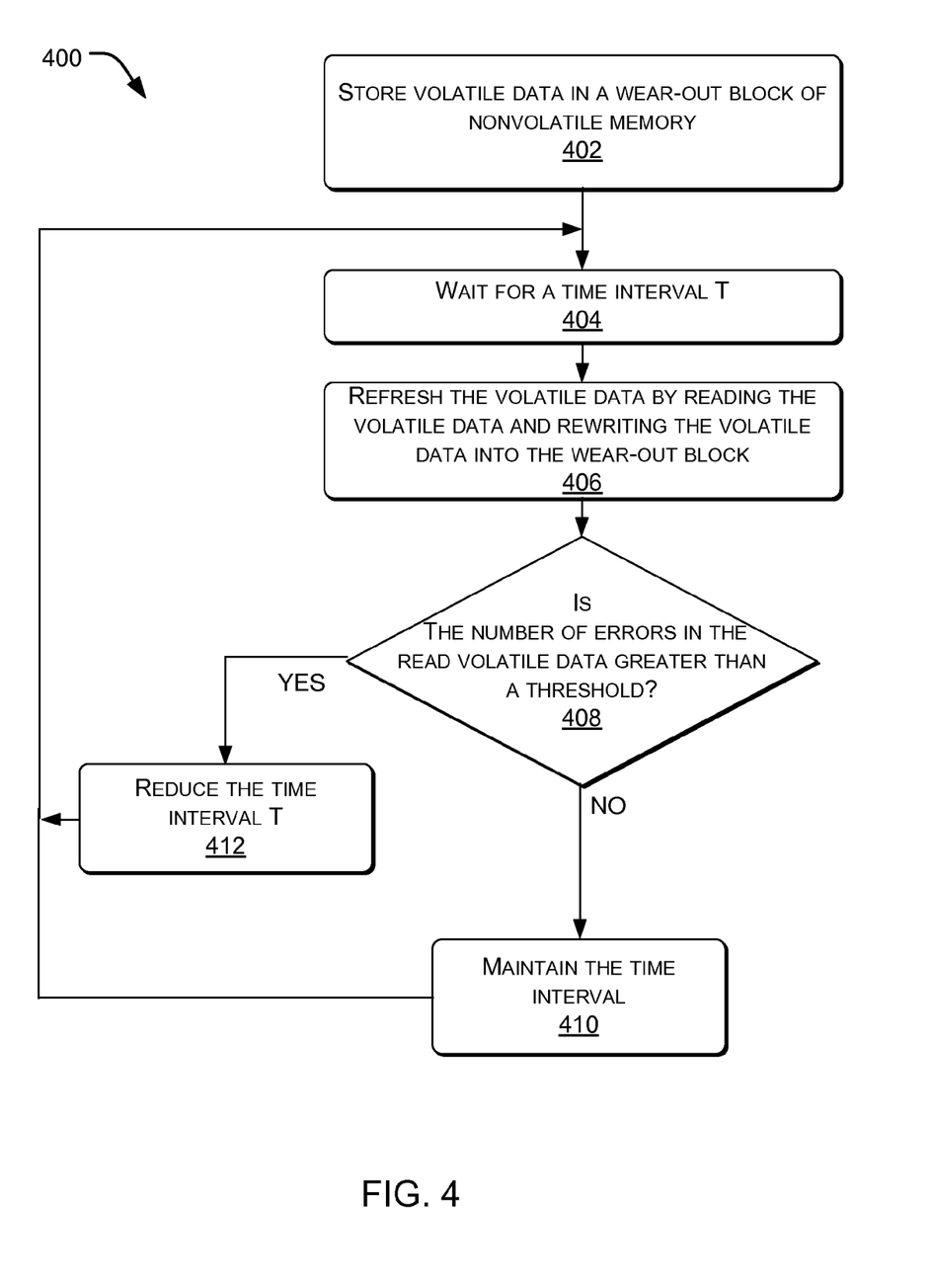
FIG. 4 is a flow diagram of a process for storing data in nonvolatile memory, according to some other embodiments.

FIG. 4 is a flow diagram of a process 400 for storing data in nonvolatile memory, according to some embodiments. At 402, a memory controller, such as memory controller 112, stores data in a wear-out block of nonvolatile memory. Such data can comprise volatile data. At 404, memory controller 112 waits for a time interval T before proceeding to 406, which involves a refresh process, such as refresh process 302 shown in FIG. 3. In particular, at 406, memory controller 112 refreshes the data by reading the data and then rewriting the data back into the wear-out block.

At 408, memory controller 112 determines whether the number of errors in the read data is greater than an error threshold. If not, then process 400 proceeds to 410 where memory controller 112 maintains the time interval at its current value (e.g., neither increasing nor decreasing the time interval T). Process 400 then returns to 404 to repeat the refresh process after the time interval T. On the other hand, if memory controller 112 determines that the number of errors in the read data is greater than the error threshold, then process 400 proceeds to 412 where memory controller 112 decreases the time interval T. Process 400 then returns to 404 to repeat the refresh process after the modified (decreased) time interval passes.

In some implementations, memory controller 112 discontinues use of the wear-out block for storing the data if the time interval that is modified becomes less than a time threshold. For example, if the result at 408 is in a reduction of the time interval a number of times (e.g., three or four times), the time interval can become small enough to render process 400 inefficient. In general, as the time interval decreases, resources of a computing system (e.g., number of clock cycles, power, and so on) to store the data in the wear-out block increase. Additionally, the time interval can become too small for the speed of memory controller 112 and the nonvolatile memory. For example, returning to FIG. 3, process errors can occur if time interval T is short enough to be similar to refresh process time $T_R$. Read process 304 includes sensing time (e.g., the time to determine the status of a memory cell, which may depend on memory types and generation) and transfer time (e.g., the 'internal' transfer time within memory itself, and transfer time from memory to memory controller. This time may depend on memory architecture and interface specifications, such as bus width and operating clock frequency). Error Correction process 306 includes time for fetching data, decoding data, and correcting data as needed. This time may depend on type of error correction code and how the algorithm is implemented. Rewrite process 308 includes encoding time for error correction, data transfer time from memory controller to memory, and program time to change the status of a target memory cell.

Accordingly, if the time interval becomes too small, memory controller 112 can abandon the wear-out block and rewrite the data previously stored in the abandoned wear-out block to another wear-out block or to a standard memory block. Memory controller 112 can designate the abandoned wear-out block as a bad block.

Figure 5:
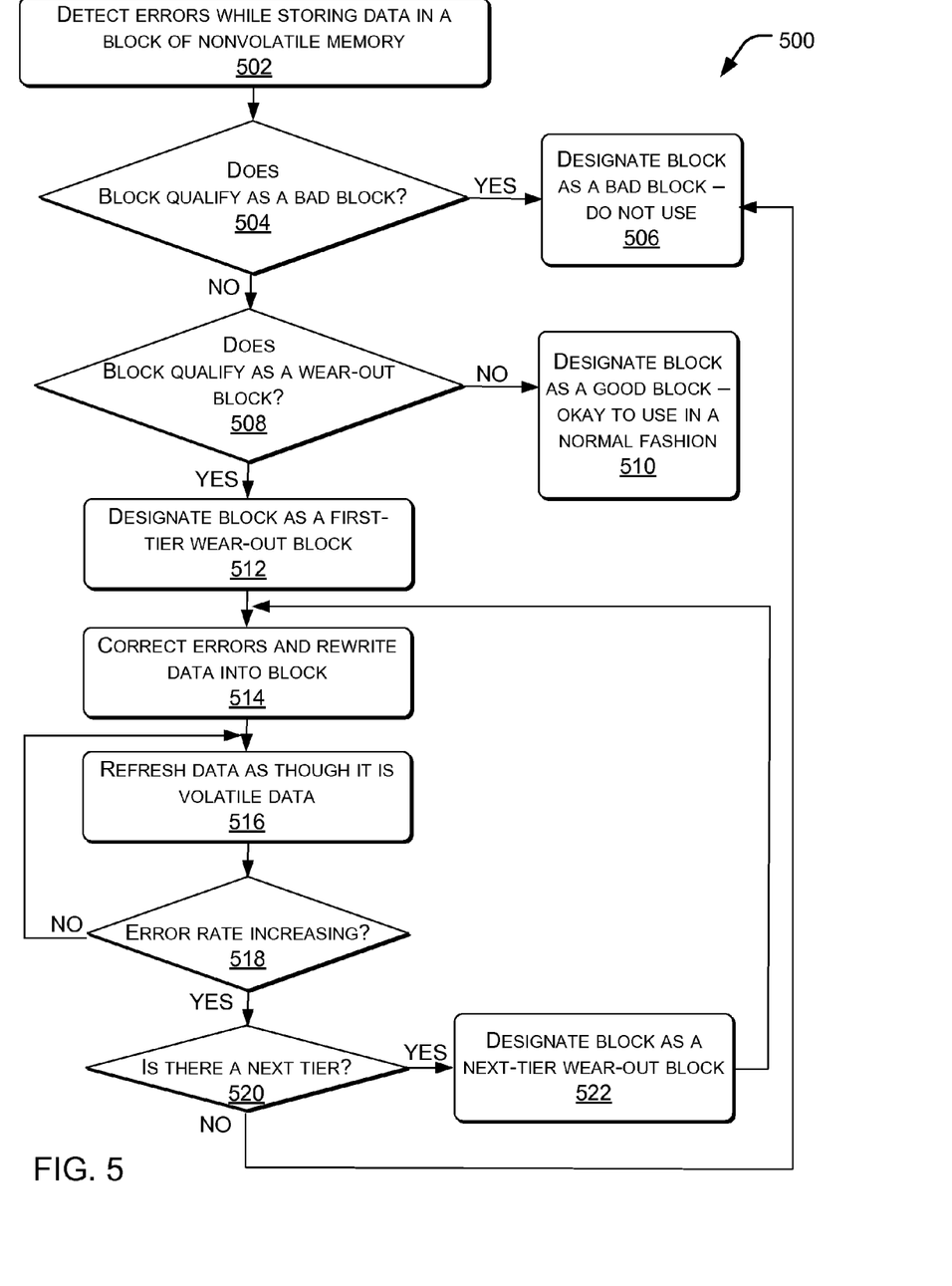
FIG. 5 is a flow diagram of a process for storing data in nonvolatile memory, according to still other embodiments.

FIG. 5 is a flow diagram of a process 500 for storing data in nonvolatile memory, according to embodiments. Process 500 also includes a process for determining whether a block of nonvolatile memory is a standard block, wear-out block, or bad block. A memory controller, such as memory controller 112, performs such determining. For example, at 502, memory controller 112 detects errors, if any, while memory controller 112 stores data in a block (e.g., a standard block or a wear-out block) of nonvolatile memory. Here, the storing process includes writing to the block and subsequently reading the written data to verify that the data was written and stored correctly. Thus, the storing process includes a process of detecting errors. At 504, memory controller 112 determines whether the block is a bad block. Such determination is based, at least in part, on the number and/or frequency of errors generated by the block and detected by memory controller 112. If the number of errors is greater than the number of errors that an ECC of memory controller 112 is capable of correcting, the block qualifies as a bad block. In this case, process 500 proceeds to 506, where memory controller 112 designates the block as a bad block that is not to be subsequently used for storing data. On the other hand, if memory controller 112 determines that the block does not qualify as a bad block, process 500 proceeds to 508, where memory controller 112 determines whether the block qualifies as a wear-out block. Such determination is based, at least in part, on the number of errors generated by the block and detected by memory controller 112. If the number of errors is within the number of errors that an ECC of memory controller 112 is capable of correcting, the block qualifies as a good block that can be used in a standard fashion. In this case, process 500 proceeds to 510 where memory controller 112 designates the block as a good block that can be used to store data in a standard fashion. On the other hand, if memory controller 112 determines that the block does not qualify as a good block, process 500 proceeds to 512, wherein memory controller 112 designates the block as a first tier wear-out block. Memory controller 112 can determine that a block does not qualify as a good block, and is instead a wear-out block, if, for example, the number of errors generated by the block can be reduced to below the number of errors that an ECC of memory controller 112 is capable of correcting if a refresh process is periodically applied to the block.

Subsequently, at 514, memory controller 112 corrects errors that were detected in 502 and rewrites data into the wear-out block. Data is consequently stored in the wear-out block as volatile data that is periodically refreshed in 516. As described earlier, a refresh process includes programming or writing data into memory and subsequently reading the programmed data from the memory.

During each periodic refresh process, memory controller 112 monitors or detects errors generated by memory cells of the wear-out block and determines an error rate. For example, an error rate can be defined as the number of errors that occur in each refresh process or the number of errors that occur per unit of time. Memory controller 112 determines the number of errors in data stored in a wear-out block that is read during a periodic refresh of the data using ECC after the data is read from the wear-out block and before the data is rewritten to the wear-out block.

At 518, memory controller 112 determines whether the error rate is increasing. If not, process 500 returns to 516 where data stored in the wear-out block continues to be periodically refreshed. On the other hand, if the error rate is increasing, process 500 proceeds to 520 where memory controller 112 determines whether a higher tiered wear-out block exists. If not, then process 500 proceeds to 506 where the memory controller designates the wear-out block as a bad block, which is no longer used to store data. On the other hand, if a higher tiered wear-out block exists, process 500 proceeds to 522 where memory controller 112 designates the wear-out block as a next-tier wear-out block. For example, if an error rate is increasing for a second tier wear-out block, memory controller 112 will designate this wear-out block as a third tier wear-out block. Process 500 then returns to 514 where memory controller 112 corrects errors and rewrites data in to the third tier wear-out block, and so on. Because a refresh process for a third tier wear-out block is different from a refresh process for a second tier wear-out block, at 516 the process is modified to apply the refresh process that is appropriate for a third tier wear-out block. For example, a time interval between refresh processes can be reduced each time a wear-out block is designated to be a next higher tier.

As used herein, the term "module" or "block" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

The description incorporates use of the phrases "in an embodiment," or "in various embodiments," which may each refer to one or more of the same or different embodiments. Furthermore, the terms "comprising," "including,"

"having," and the like, as used with respect to embodiments of the present disclosure, are synonymous.

Various operations may have been described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

Although specific embodiments have been illustrated and described herein, it is noted that a wide variety of alternate and/or equivalent implementations may be substituted for the specific embodiment shown and described without departing from the scope of the present disclosure. The present disclosure covers all methods, apparatus, and articles of manufacture fairly falling within the scope of the appended claims either literally or under the doctrine of equivalents. This application is intended to cover any adaptations or variations of the embodiment disclosed herein. Therefore, it is manifested and intended that the present disclosure be limited only by the claims and the equivalents thereof.

What is claimed is:

1. A method comprising:
designating a portion of a nonvolatile memory as a wear-out portion of the nonvolatile memory, in response to the portion of the nonvolatile memory being error-prone beyond a particular threshold;
storing volatile data in the wear-out portion of the nonvolatile memory;
over a time interval, periodically refreshing the volatile data in the wear-out portion of the nonvolatile memory by (i) reading the volatile data from the wear-out portion of the nonvolatile memory and (ii) rewriting the volatile data to the wear-out portion of the nonvolatile memory;
determining a number of errors in the volatile data that is read during the periodic refresh of the volatile data; and
based, at least in part, on the number of errors that is determined, modifying the time interval.

2. The method of claim 1, further comprising:
if the number of errors is determined to be greater than an error threshold value, decreasing the time interval.

3. The method of claim 1, the method further comprising:
if the time interval that is modified is less than a time threshold, discontinuing use of the wear-out portion of the nonvolatile memory for the volatile data.

4. The method of claim 3, further comprising:
writing the volatile data to another portion of the nonvolatile memory.

5. The method of claim 1, wherein:
the nonvolatile memory is managed by a memory controller that includes an error correction code; and
the nonvolatile memory includes memory cells that produce errors that are not correctable by the error correction code.

6. The method of claim 1, wherein determining the number of errors in the volatile data that is read during the periodic refresh of the volatile data is performed by an error correction code (i) after reading the volatile data from the wear-out portion of the nonvolatile memory and (ii) before rewriting the volatile data to the wear-out portion of the nonvolatile memory.

7. The method of claim 1, wherein the periodic refresh of the volatile data is performed without erasing any portion of the volatile data stored in the wear-out portion of the nonvolatile memory.

8. A system comprising:
a nonvolatile memory; and
a memory controller, wherein the memory controller is configured to
designate a portion of the nonvolatile memory as a wear-out portion of the nonvolatile memory, in response to the portion of the nonvolatile memory being error-prone beyond a particular threshold;
store volatile data in the wear-out portion of the nonvolatile memory,
over a time interval, periodically refresh the volatile data in the wear-out portion of the nonvolatile memory by (i) reading the volatile data from the wear-out portion of the nonvolatile memory and (ii) rewriting the volatile data to the wear-out portion of the nonvolatile memory,
determine if a number of errors in the volatile data that is read during the periodic refresh of the volatile data is greater than an error threshold value, and
modify the time interval based, at least in part, on the number of errors that is determined.

9. The system of claim 8, wherein the memory controller is further configured to:
discontinue use of the wear-out portion of the nonvolatile memory for the volatile data if the time interval that is modified is less than a time threshold.

10. The system of claim 9, wherein the memory controller is further configured to:
write the volatile data to another wear-out portion of the nonvolatile memory.

11. The system of claim 8, wherein
the memory controller includes an error correction code, and
the nonvolatile memory includes memory cells that produce errors that are not correctable by the error correction code.

12. The system of claim 8, wherein the memory controller is configured to determine the number of errors in the volatile data that is read during the periodic refresh of the volatile data by using an error correction code (i) after the volatile data is read from the wear-out portion of the nonvolatile memory and (ii) before the volatile data is rewritten to the wear-out portion of the nonvolatile memory.

13. The system of claim 8, wherein the periodic refresh of the volatile data is performed without erasing any portion of the volatile data stored in the wear-out portion of the nonvolatile memory.

14. A nonvolatile memory device comprising:
a memory cell array including a wear-out memory portion that is error-prone beyond a predetermined threshold; and
a controller configured to
store volatile data in the wear-out memory portion,
refresh the volatile data by (i) reading the volatile data from the wear-out memory portion and (ii) rewriting the volatile data to the wear-out memory portion, wherein the volatile data is refreshed periodically at a time interval,
determine if a number of errors in the volatile data that is read during the periodic refresh of the volatile data is greater than an error threshold value, and modify the time interval based, at least in part, on the number of errors detected in the volatile data that is read during the periodic refresh.

15. The nonvolatile memory device of claim 14, wherein the controller is further configured to:
store nonvolatile data in the memory cell array in memory cells that are not included in the wear-out memory portion.

16. The nonvolatile memory device of claim 14, wherein the controller is further configured to:
discontinue use of the wear-out memory portion for the volatile data if the time interval that is modified is less than a time threshold.

17. The nonvolatile memory device of claim 14, wherein the controller is further configured to:
write the volatile data to another wear-out memory portion in the memory cell array.

18. The nonvolatile memory device of claim 14, wherein:
the controller includes an error correction code; and
the wear-out memory portion includes memory cells that produce errors that are not correctable by the error correction code.

19. The nonvolatile memory device of claim 14, wherein the controller is configured to determine the number of errors in the volatile data that is read during the periodic refresh of the volatile data by using an error correction code (i) after the volatile data is read from the wear-out memory portion and (ii) before the volatile data is rewritten to the wear-out memory portion.

20. The nonvolatile memory device of claim 14, wherein the periodic refresh of the volatile data is performed without erasing any portion of the wear-out memory portion.

* * * * *